United States Patent [19]
Hasegawa et al.

[11] Patent Number: 5,429,544
[45] Date of Patent: Jul. 4, 1995

[54] POLISHING APPARATUS FOR NOTCH PORTION OF WAFER

[75] Inventors: Fumihiko Hasegawa; Tatsuo Ohtani, both of Fukushima; Koichiro Ichikawa; Yoshio Nakamura, both of Nagano, all of Japan

[73] Assignees: Shin-Etsu Handotal Co., Ltd., Tokyo; Fujikoshi Machinery Corp., Nagano, both of Japan

[21] Appl. No.: 265,792

[22] Filed: Jun. 27, 1994

[30] Foreign Application Priority Data

Jul. 8, 1993 [JP] Japan .................. 5-193195

[51] Int. Cl.⁶ .................................... B24B 19/00
[52] U.S. Cl. .................... 451/226; 451/388; 451/414; 451/366; 451/387
[58] Field of Search ............... 451/44, 388, 414, 366, 451/232, 226, 216, 213, 212, 387

[56] References Cited

U.S. PATENT DOCUMENTS

| | | | |
|---|---|---|---|
| 1,220,287 | 3/1917 | Styll | 51/240 A |
| 2,275,483 | 3/1942 | Parker | 51/96 |
| 4,174,592 | 11/1978 | Bernhardt | 51/101 R |
| 5,185,965 | 2/1993 | Ozaki | 51/283 E |
| 5,271,185 | 12/1993 | Hosokawa | 51/283 E |

FOREIGN PATENT DOCUMENTS

| | | |
|---|---|---|
| 360939 | 4/1990 | European Pat. Off. . |
| 487460 | 5/1992 | European Pat. Off. . |
| 2702261 | 7/1977 | Germany . |
| 0087523 | 3/1990 | Japan .................. 51/283 E |

Primary Examiner—Jack W. Lavinder
Attorney, Agent, or Firm—Oliff & Berridge

[57] ABSTRACT

An polishing apparatus which can effectively polish a bottom wall of a wafer in a notch portion is disclosed. The apparatus includes: a table for supporting the wafer thereon; a rotary buff having a thickness so that the periphery thereof can enter the notch portion of the wafer, and is rotated around an axis which is parallel with a plane of the surface of the wafer supported on the table; a first rotating member such as a motor for rotating the rotary buff; a linkage for supporting the rotary buff; an adjusting member such as a cylinder device for adjusting the pressure applied to the bottom wall of the wafer in the notch portion from the rotary buff; and a second rotating member for turning the table around a predetermined axis which is approximately parallel with the rotary axis of the rotary buff so that the applied pressure from the rotary buff acts on the bottom wall of the wafer in the notch portion in a direction approximately perpendicular to the surface of the bottom wall.

17 Claims, 4 Drawing Sheets

POLISHING APPARATUS FOR NOTCH PORTION OF WAFER

BACKGROUND OF THE INVENTION

1. Field of the Invention

The present invention relates to a polishing apparatus for a notch portion formed on the periphery of a wafer (hereinafter, which is simply called "a polishing apparatus") which is used for positioning adjustment or crystal orientation adjustment of the wafer.

2. Description of Related Art

Generally, a photolithographic technique is used for the purpose of forming a pattern for a semiconductor integrated circuit in a single crystal of Si, compound semiconductor or the like (hereinafter, which is simply called "a wafer"). Such an application of the photolithographic technique requires a precise positioning adjustment and a precise crystal orientation adjustment. For these requirement, a linear portion is generally made on one side of the periphery of the wafer in order to use the linear portion as a standard for the positioning adjustment and the crystal orientation adjustment. This linear portion of the wafer is called an orientation flat.

When such an orientation flat is formed on the wafer, a portion of the periphery of the wafer is cut off linearly. Therefore, the area of the cut portion of the wafer is large, so the number of semiconductor chips which can be obtained from a wafer decrease. As a result, according to such a conventional method in which an orientation flat is formed on a wafer, it is impossible to effectively utilize an expensive wafer. The conventional method has another problem in that it is difficult to treat wafers when each of the wafers has a large diameter and an orientation flat, so the wafers are not properly in balance, for example, on a work using a spin dryer or the like in which the wafers are dried by a centrifugal force due to a high speed rotation.

Recently, in order to solve the above problems, another method has been used in which a small notch having a circular arc shape or a shape of a character "V" in plan view is formed in a portion of the periphery of each wafer. In this method, positioning and crystal orientation adjustments of the wafer are carried out by using the notch.

Such a notch is formed by using a grinding wheel 31 or the like, as shown in FIG. 3. That is, the notch portion 32 is formed by making the grinding wheel 31 press into a portion of the periphery of the wafer W and by grinding the portion, as shown in the plan view of FIG. 4. FIG. 5 is a vertically cross-sectional view showing the wafer W cut along the line 5—5 of FIG. 4. The wall of the wafer W in the notch portion 32 swells into a curve toward the outside in the middle of vertical direction, as shown in this Figure.

In a photolithographic process, particles may be a main impact to form fine patterning for semiconductor devices. Therefore, in order to minimize the amount of the particles, a clean room having a higher cleanliness is required. Furthermore, it is desired to suppress generation of particles from the wafer as less as possible.

In order to solve the above problems, it is necessary to polish the wall of the wafer in the notch portion 32 and thereby to prevent generation of particles when the wall of the wafer in the notch portion 32 is in contact with a hard pin for crystal orientation adjustment of the wafer. However, the width of the notch portion 32 to be formed is smaller than that of the orientation flat. As mentioned above, the notch portion 32 has a circular arc shape or a shape of a character "V" in plan view and the wall of the wafer W in the notch portion 32 has a complicated shape. Therefore, it is difficult to polish this portion.

SUMMARY OF THE INVENTION

The present invention was developed in view of the above-described problems. An object of the present invention is to provide an apparatus which can effectively polish the wall of the wafer in the notch portion.

In accordance with the present invention, the polishing apparatus comprising: a table for supporting the wafer thereon; a rotary buff having a thickness so that the periphery thereof can enter the notch portion of the wafer, and is rotated around an axis which is parallel with a plane of the surface of the wafer supported on the table; a first rotating member for rotating the rotary buff; a linkage for supporting the rotary buff; an adjusting member for adjusting the pressure applied to the bottom wall of the wafer in the notch portion (hereinafter, which is simply called "the bottom wall"), i.e., the back wall of the wafer nearest to the center of the wafer W in the notch portion, from the rotary buff; and a second rotating member for turning the table around a predetermined axis which is approximately parallel with the rotary axis of the rotary buff so that an applied pressure from the rotary buff acts on the bottom wall in a direction approximately perpendicular to the surface of the bottom wall.

In the polishing apparatus of the present invention, the rotary buff is pressed against the notch portion of the wafer supported on the table, by the adjusting member such as a cylinder device, and the rotary buff is rotated on the center axis thereof by the first rotating member such as an electric motor. Further, the table is turned around a predetermined axis which is approximately parallel with the rotary axis of the rotary buff by the second rotating member such as a pulse motor so that the applied pressure from the rotary buff acts on the bottom wall in a direction approximately perpendicular to the surface of the bottom wall. Consequently, since the rotating buff presses the bottom wall, while following on the surface of the wall, the bottom wall can be polished. The pressure applied to the bottom wall can be always maintained constantly in spite of the attitude or angle of the wafer by the adjusting member. Accordingly, it is possible to obtain a bottom wall having an excellent polishing surface.

Preferably, the table has a pulse motor which can reciprocally rotate the wafer supported on the table around the center thereof in clockwise and counterclockwise directions within a predetermined small angle.

Accordingly, it is possible to make the wafer reciprocally rotate around the center thereof in clockwise and counterclockwise directions within a predetermined small angle. So the side walls of the wafer in the notch portion can be polished. As a result, the whole wall, i.e., not only the bottom wall but also the side walls, of the wafer in the notch portion can be excellently polished.

Preferably, the table may be communicated with a vacuum absorption system 11, so that the wafer can be held on the table by vacuum absorption. The second electric motor may be a pulse motor.

The table may be preferably supported on a crank having a pair of crankshafts. One of the crankshafts may be connected with the second electric motor so that the table can be turned around the crankshaft through the crank having the crankshaft, by means of the second motor. The other of the crankshafts may be supported by a bearing. The bearing and the second electric motor may be disposed so that the pair of crankshafts are on a straight line which is parallel with the plane of the surface of the wafer supported on the table. The wafer may be set on the table so that the straight line is substantially in contact with the notch portion of the wafer.

Preferably, the polishing apparatus further comprises a linkage which has a first fixed link and a second link for supporting the rotary buff, and the second link may be provided so as to be movable like a seesaw on a shaft which is attached to an upper portion of a bracket erected on the first fixed link. The rotary buff and the first electric motor may be attached to one end of the second link, and the cylinder device may be disposed between an end of the first link opposite to the rotary buff and the other end of the second link.

Preferably, the polishing apparatus further comprises a construction so that the table is relatively movable with respect to the crankshafts. An alkaline solution with dispersed colloidal silica may be supplied as a polishing agent into the notch portion of the wafer, during polishing. The cylinder device may be one selected from the group consisting of an air cylinder device, and a hydraulic cylinder device. The linkage holding the rotary buff may be preferably balanced with respect to a shaft which works as a fulcrum. The air-pressure in the cylinder device may be kept constant so that the pressure applied to the wall of the wafer in the notch portion is substantially maintained constantly in spite of the attitude or angle of the linkage.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

PREFERRED EMBODIMENT OF THE INVENTION

A preferred embodiment of the polishing apparatus according to the present invention will be explained with reference to the drawings.

Figure 1:
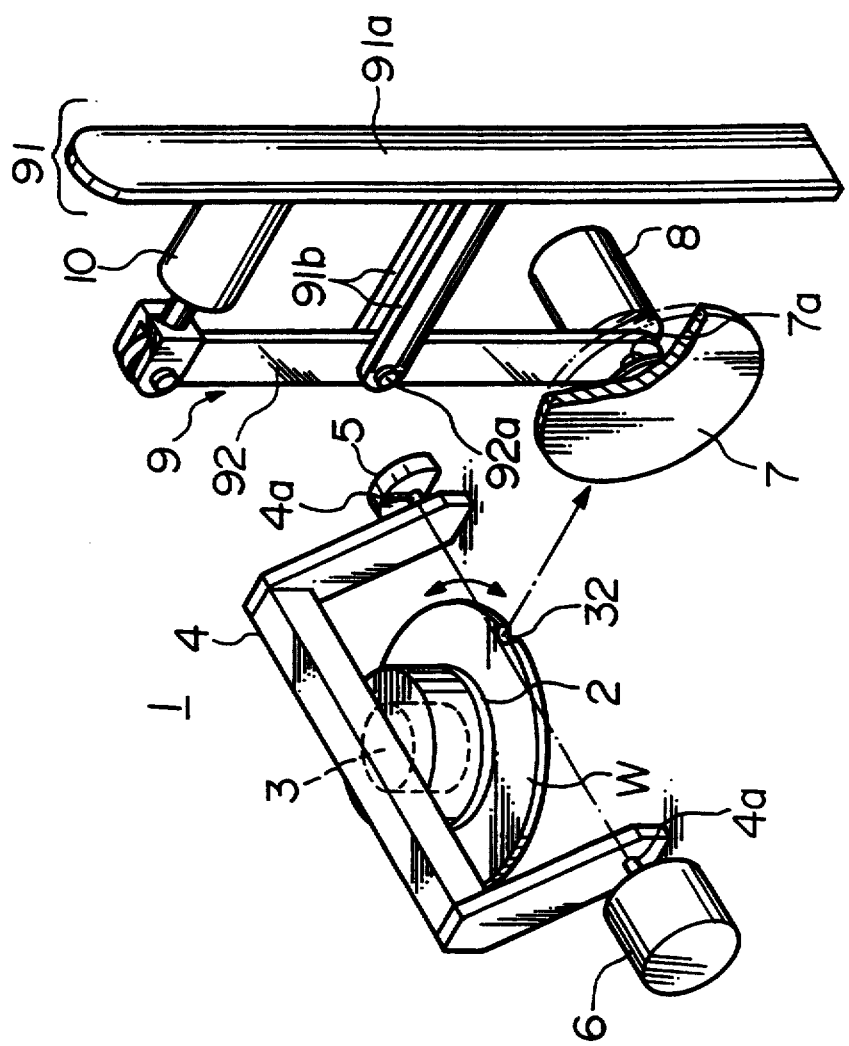
FIG. 1 is a perspective view showing an polishing apparatus for a notch portion of a wafer according to an embodiment of the present invention.

FIG. 1 shows an polishing apparatus according to an embodiment of the invention. In this Figure, numeral 1 denotes the polishing apparatus. The polishing apparatus 1 comprises a table 2 holding a wafer W thereon, and a pulse motor 3 which is attached to a crank 4 and can repeatedly make the table 2 reciprocally rotate in clockwise and counterclockwise directions within a predetermined small angle around the center thereof. A vacuum absorption system 11 is communicated with the table 2, so that the wafer W can be held on the table 2 by vacuum absorption. The table 2 is supported on a crank 4 with a pair of crankshafts 4a and 4a. One of the crankshafts 4a and 4a is supported by a bearing 5, and the other is connected with a pulse motor (a second motor) 6.

The polishing apparatus 1 comprises a rotary buff 7 which is made of an elastic material, e.g., a synthetic resin such as foamed polyurethane or the like. The rotary buff 7 is connected with an electric motor (a first motor) 8 which makes the rotary buff 7 rotate, and is supported by a linkage 9. The rotary buff 7 can rotate around a shaft 7a which is parallel with the plane of the surface of the wafer W held on the table 2.

The linkage 9 comprises a fixed first link 91 having a plate 91a and a pair of brackets 91b and 91b, and a second link 92. The pair of brackets 91b and 91b are erected at the middle on the plate 91a of the fixed first link 91. The second link 92 is provided so that the link 92 is movable like a seesaw on a shaft 92a which is provided to an upper portion of the brackets 91b and 91b. The rotary buff 7 and the electric motor 8 are provided on one end of the second link 92. An air cylinder device 10 is disposed between the other end of the second link 92 and a side of the fixed first link 91 opposite to the rotary buff 7. That is, the bottom of the air cylinder device 10 is mounted flexibly on the plate 91a, and the top end of a rod of the air cylinder device 10 is provided so as to form a turning pair with the second link 92. The air cylinder device 10 is communicated with an air supply and exhaust equipment and an air pressure control unit, which are shown in the drawings as element 12.

Next, procedure for polishing the notch portion 32 of the wafer W carried out by the polishing apparatus 1 of a notch portion will be explained.

First, a wafer W is set on the table 2 by vacuum absorption or the like. When the wafer W is set on the table, the wafer W is set up so that the notch portion 32 of the wafer W is positioned on the straight line which connects the pair of crankshafts 4a and 4a. For properly setting up the wafer W, it is desired to previously and properly set up the relationship between the positions of the crankshafts 4a and 4a and the position of the table 2, or to provide a construction so that the table 2 can be relatively moved with respect to the crankshafts 4a and 4a. When the wafer W is set on the table 2, the rotary buff 7 is apart from the wafer W by using the air cylinder device 10.

Figure 2:
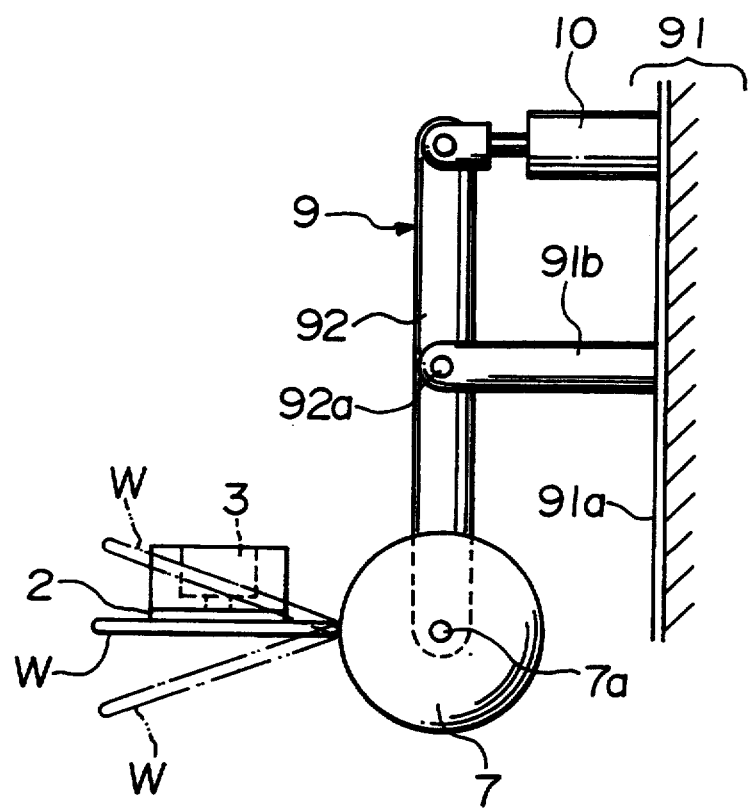
FIG. 2 is a side view for explaining the polishing apparatus for the notch portion of the wafer as shown in FIG. 1.
Figure 3:
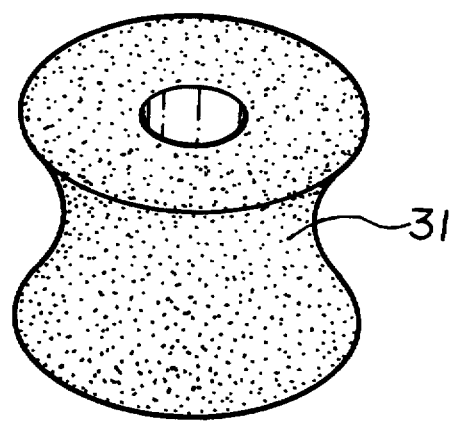
FIG. 3 is a perspective view showing a grinding wheel for grinding the notch portion of the wafer.
Figure 4:
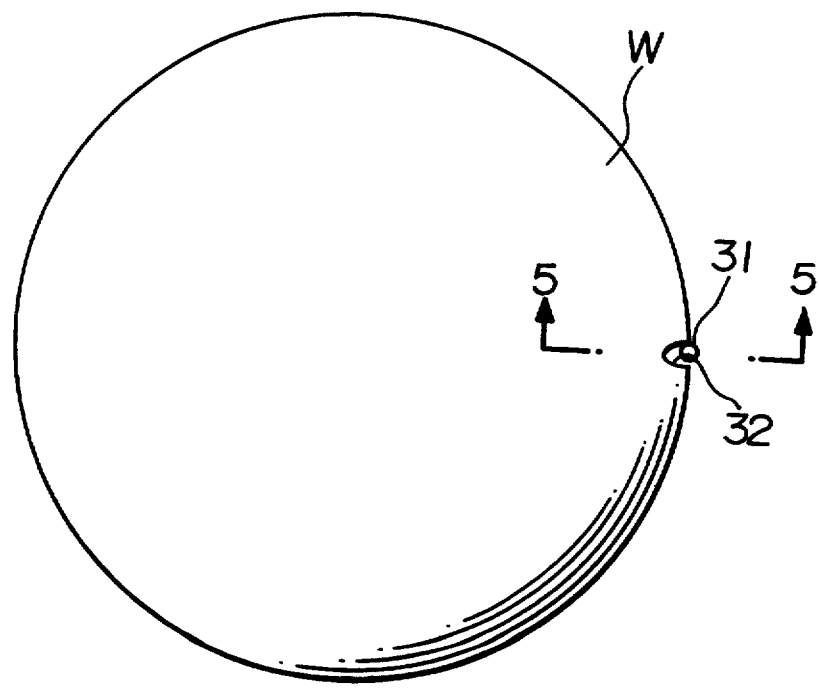
FIG. 4 is a plan view showing a wafer having a notch portion.
Figure 5:
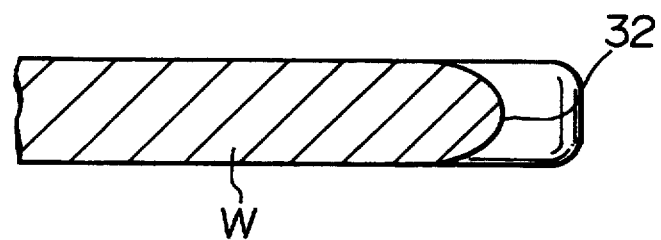
FIG. 5 is a vertically cross-sectional view taken along the line 5—5 in FIG. 4.

Next, the air cylinder device 10 is operated to press the rotary buff 7 against the wall of the wafer W in the notch portion 32. Then, the pressing portion of the peripheral surface of the rotary buff 7 is elastically deformed to a small extent, and thereby the rotary buff 7 comes in contact with the wafer W in a larger area of the notch portion 32. Thereafter, the table 2 is slowly turned around the crankshafts 4a by the pulse motor 6 so that the applied pressure from the rotary buff 7 acts on the swelling wall of the wafer W in the notch portion 32 in a direction perpendicular to the surface of the swelling wall, while the rotary buff 7 is rotated by the electric motor 8, as shown in FIG. 2. Consequently, the rotating buff 7 presses the wall of the wafer W in the notch portion 32, with following the surface of the wall, and thereby the wall can be polished. During this operation, a polishing agent, e.g., an alkaline solution with dispersed colloidal silica or the like, is supplied into the notch portion 32. The turning operation of the table 2 around the above mentioned pair of crankshafts 4a and 4a is carried out in a manner of reciprocating motion a predetermined number of times along the surface of the wafer W in the notch portion 32.

The table 2 may be reciprocally rotated around the center thereof in clockwise and counterclockwise directions within a predetermined angle by the pulse motor 3, if necessary. Accordingly, the whole wall, i.e., not only the bottom wall but also the side walls, of the wafer W in the notch portion 32 can be polished.

The above-described apparatus 1 for polishing a notch portion provides advantages as follows.

According to the polishing apparatus of this embodiment, it is possible to effectively polish the wall of the wafer W in the notch portion, since the rotary buff 7 moves so as to follow the swelling curved surface of the wall in the notch portion 32. The table 2 is turned around the crankshafts 4a and 4a so that the applied pressure from the rotary buff 7 acts on the wall of the wafer W in the notch portion 32 in a direction perpendicular to the surface of the wall. The pressure can be constantly maintained by the second link 92 supporting the rotary buff 7 being in balance with respect to the shaft 92a and by keeping the air-pressure in the cylinder device 10 constant. Accordingly, it is possible to obtain an excellent polishing surface over the whole wall of the wafer in the notch portion.

The table 2 can make the notch portion 32 of the wafer W reciprocally rotate in clockwise and counterclockwise directions within a predetermined angle by the pulse motor 3, on a plane perpendicular to the pressing direction of the rotary buff 7 around the center thereof. Accordingly, the whole wall of the wafer in the notch portion can be excellently polished.

Although the present invention has been described in its preferred form with a certain degree of particularity, it should also be understood that the present invention is not limited to the preferred embodiment and that various changes and modifications may be made to the invention without departing from the spirit and scope thereof.

For example, the air cylinder device 10 is used in the above embodiment, however, a hydraulic cylinder device can be also used instead of the air cylinder device 10.

As described above, according to the present invention, since the rotary buff that is rotating moves simultaneously so as to follow the swelling curved surface of the wall of the wafer in the notch portion, it is possible to effectively polish the wall of the wafer in the notch portion. The pressure applied from the rotary buff to the wall of the wafer W in the notch portion can be constantly maintained by the link supporting the rotary buff being in balance with respect to the shaft and by keeping the air-pressure in the cylinder device constant. Accordingly, it is possible to obtain an excellent polishing surface.

The table can make the notch portion of the wafer reciprocally rotate around the center thereof in a clockwise and a counterclockwise directions within a predetermined angle. Accordingly, the whole wall of the wafer in the notch portion can be excellently polished.

What is claimed is:

1. A polishing apparatus for a notch portion formed on a periphery of a wafer comprising:
   a table for supporting the wafer thereon, said table being supported by a crank having a pair of crankshafts;
   a rotary buff having a thickness so that a periphery thereof can enter the notch portion of the wafer, said rotary buff being rotatable around an axis which is approximately parallel with the crankshafts;
   a first rotating member for rotating said rotary buff;
   a linkage for supporting said rotary buff;
   an adjusting member for adjusting pressure applied to a bottom wall of the wafer in the notch portion from said rotary buff; and
   a second rotating member for turning said table around a predetermined axis which is approximately parallel with the rotary axis of said rotary buff so that an applied pressure from the rotary buff acts on the bottom wall of the wafer in the notch portion in a direction approximately perpendicular to a surface of said bottom wall;
   wherein one of the crankshafts is connected with said second rotating member, so that said table can be turned around said one crankshaft by means of the second rotating member through the crank having the crankshafts and said table is relatively movable with respect to the crankshafts.

2. A polishing apparatus according to claim 1, wherein said linkage brings the rotary buff in contact with and apart from the wafer.

3. A polishing apparatus according to claim 2, wherein said linkage comprises:
   a fixed first link and a second link for supporting said rotary buff, said second link being provided to be movable like a seesaw on a shaft which is provided to an upper portion of a bracket erected on said fixed first link.

4. A polishing apparatus according to claim 3, wherein said rotary buff and said first rotating member are provided to one end of said second link, and said adjusting member is disposed between an end of said fixed first link opposite said rotary buff and the other end of said second link.

5. A polishing apparatus according to claim 1, further comprising:
   means for reciprocally rotating said table around a center thereof in clockwise and counterclockwise directions within a predetermined small angle so that side walls of the wafer in the notch portion can be polished by the rotary buff.

6. A polishing apparatus according to claim 5 wherein said means for reciprocally rotating said table comprises a pulse motor.

7. A polishing apparatus as claimed in claim 1, wherein said table is communicated with a vacuum absorption system, so that the wafer can be held on the table by vacuum absorption.

8. A polishing apparatus according to claim 1, wherein said second rotating member comprises a pulse motor.

9. A polishing apparatus according to claim 1, wherein the other of the pair of crankshafts is supported by a bearing.

10. A polishing apparatus according to claim 9, wherein said bearing and said second rotating member are disposed so that the pair of crankshafts are on an axis which is approximately parallel with said axis of the rotary buff.

11. A polishing apparatus according to claim 10, wherein the wafer is disposed on the table so that said straight line passes through the notch portion of the wafer.

12. A polishing apparatus as claimed in claim 1, further comprising means for supplying an alkaline solution with dispersed colloidal silica as a polishing agent into the notch portion of the wafer during polishing.

13. A polishing apparatus according to claim 1, wherein said adjusting member comprises a cylinder device for operating said linkage supporting the rotary buff.

14. A polishing apparatus according to claim 13, wherein said cylinder device is a device selected from the group consisting of an air cylinder device and a hydraulic cylinder device.

15. A polishing apparatus according to claim 1, further comprising:

means for maintaining an air-pressure in said cylinder device constant so that the pressure applied to the bottom wall of the wafer in the notch portion is substantially constantly maintained in spite of an attribute or angle of the wafer on the table.

16. A polishing apparatus for a notch portion formed on a periphery of a wafer comprising:

a table for supporting the wafer thereon said table supported by a crank having a pair of crankshafts;

a rotary buff having a periphery with a section of almost the same shape as a shape of the notch portion in a plan view, said rotary buff being rotatable around a shaft which is approximately parallel with the crankshafts;

a first electric motor for rotating said rotary buff;

a cylinder device for moving the rotary buff in contact with and apart from the wafer supported on the table through a linkage for supporting the rotary buff; and a second electric motor for turning the table around a predetermined axis which is approximately parallel with a rotary axis of said rotary buff so that an applied pressure from the rotary buff acts on a bottom wall of the wafer in the notch portion in a direction approximately perpendicular to a surface of said bottom wall;

wherein one of the crankshafts is connected with said second electric motor, so that said table can be turned around said one crankshaft by means of the second electric motor through the crank having the crankshafts and said table is relatively movable with respect to the crankshafts.

17. A polishing apparatus according to claim 16, further comprising:

means for reciprocally rotating said table around a center thereof in clockwise and counterclockwise directions within a predetermined small angle so that side walls of the wafer in the notch portion can be polished by the rotary buff.

* * * * *

UNITED STATES PATENT AND TRADEMARK OFFICE
CERTIFICATE OF CORRECTION

PATENT NO. : 5,429,544
DATED : July 4, 1995
INVENTOR(S) : Fumihiko HASEGAWA, Tatsuo OHTANI, Koichiro ICHIKAWA and Yoshio NAKAMURA It is certified that error appears in the above-indentified patent and that said Letters Patent is hereby corrected as shown below:

On title page, item

[73] Assignees, change "Shin-Etsu Handotal Co., Ltd." to --Shin-Etsu Handotai Co., Ltd.--

Signed and Sealed this

Tenth Day of October, 1995

Attest:

BRUCE LEHMAN

*Attesting Officer*       *Commissioner of Patents and Trademarks*